(12) United States Patent
Yang et al.

(10) Patent No.: US 6,844,901 B2
(45) Date of Patent: Jan. 18, 2005

(54) LIQUID CRYSTAL DISPLAY DEVICE AND METHOD OF MANUFACTURING THE SAME

(75) Inventors: Chang Kuk Yang, Kyongsangbuk-do (KR); Hwan Kim, Taegu-kwangyokshi (KR); Ki Choon Park, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 28 days.

(21) Appl. No.: 10/608,376

(22) Filed: Jun. 30, 2003

(65) Prior Publication Data

US 2004/0027504 A1 Feb. 12, 2004

(30) Foreign Application Priority Data

Aug. 7, 2002 (KR) ............................. P10-2002-0046620

(51) Int. Cl.⁷ .............................................. G02F 1/136
(52) U.S. Cl. ........................................ 349/43; 438/30
(58) Field of Search ............................. 349/42, 43, 44, 349/46, 38, 39; 438/30; 257/59, 72

(56) References Cited

U.S. PATENT DOCUMENTS 6,075,257 A * 6/2000 Song ........................... 257/59
6,714,267 B2 * 3/2004 Choi et al. ..................... 349/43
6,717,631 B2 * 4/2004 Choi ............................. 349/43
6,734,935 B2 * 5/2004 Kim et al. ................... 349/114

* cited by examiner

Primary Examiner—Kenneth Parker
Assistant Examiner—David Chung
(74) Attorney, Agent, or Firm—Morgan, Lewis & Bockius LLP

(57) ABSTRACT

A method for manufacturing a liquid crystal display device includes forming a gate line and a gate electrode on a substrate, forming a gate insulating layer on an entire surface of the substrate including the gate line, forming a semiconductor layer on the gate insulating layer above the gate electrode, depositing a metal layer on an entire surface of the gate insulating layer including the semiconductor layer, forming a mask pattern for patterning a data line and source and drain electrodes on the metal layer, and forming a data line perpendicular to the gate line, and the source and drain electrodes by simultaneously removing portions of the metal layer with the mask pattern and removing a first thickness of the gate insulating layer.

16 Claims, 14 Drawing Sheets

LIQUID CRYSTAL DISPLAY DEVICE AND METHOD OF MANUFACTURING THE SAME

The present invention claims the benefit of the Korean Application No. P2002-46620 filed on Aug. 7, 2002, which is hereby incorporated by reference.

BACKGROUND OF THE INVENTION

1. Field of the Invention

The present invention relates to a display device and method of manufacturing a display device, and more particularly, to a liquid crystal display device and method of manufacturing a liquid crystal display device.

2. Discussion of the Related Art

Among the various flat display devices, such as liquid crystal display (LCD) devices, plasma display panel (PDP) devices, electroluminescent display (ELD) devices, and vacuum fluorescent display (VFD) devices, the liquid crystal display (LCD) devices have been most commonly used because of their thin profile, light weight, and low power consumption. Accordingly, the LCD devices are commonly substituted for Cathode Ray Tube (CRT) devices. In addition, in mobile type LCD devices, such as a display for a notebook computer, the LCD devices have been developed for computer monitors and televisions to receive and display broadcasting signals.

Despite various technical developments within the LCD technologies, enhancement of picture quality of the LCD devices has been lacking. Accordingly, in order to incorporate the LCD devices into general display devices, high quality picture, such as high resolution and high luminance in large-sized display screens, must be achieved while maintaining the light weight, thin profile, and low power consumption.

A common LCD device includes an LCD panel for displaying a picture image, and a driving part for supplying a driving signal to the LCD panel. The LCD panel includes lower and upper glass substrates bonded to each other at predetermined intervals, and a liquid crystal material layer injected between the lower and upper glass substrates.

The lower substrate (TFT array substrate) includes a plurality of gate lines arranged along a first direction at fixed intervals, a plurality of data lines arranged along a second direction at fixed intervals perpendicular to the first direction, a plurality of pixel electrodes formed in a matrix configuration in pixel regions defined by intersections of the plurality of gate and data lines, and a plurality of switching thin film transistors responsive to signals of the gate lines for transmitting signals of the data lines to the pixel electrodes. In addition, the upper substrate (color filter array substrate) includes a black matrix layer for preventing light from leaking onto portions of the lower substrate except the pixel regions, color filter layers for displaying red, green, and blue colors, and a common electrode.

In general, the LCD device is driven according to optical anisotropy and polarizability of liquid crystal molecules of the liquid crystal material layer. The liquid crystal molecules are aligned due to their long and thin shapes. For example, an electric field is induced to the liquid crystal material layer for controlling alignment directions of the liquid crystal molecules. Accordingly, the alignment directions of the liquid crystal molecules varies, and light is refracted along the alignment directions of the liquid crystal molecules according to the optical anisotropy of the liquid crystal material layer, thereby displaying image data, i.e., a picture.

Presently, active matrix type thin film transistor (TFT) LCD devices have been developed, wherein pixel electrodes for displaying the image data are controlled with a TFT having a semiconductor layer formed on a lower substrate. The active matrix type TFT LCD devices are divided into Inverted Staggered structures and Normal Staggered structures according to locations of gate, source, and drain electrodes. In the Inverted Staggered structure, the gate electrode is formed below the semiconductor layer, and the source and drain electrodes are formed above the semiconductor layer. In the Normal Staggered structure, the gate electrode is formed above the semiconductor layer, and the source and drain electrodes are formed below the semiconductor layer. It is preferred to form the active matrix type TFT LCD device as the Inverted Staggered structure since the Inverted Staggered structure has simplified manufacturing processes, and does not require a TFT black matrix layer.

The Inverted Staggered structure includes a gate electrode on a glass substrate, a gate insulating layer on an entire surface of the substrate including the gate electrode, a semiconductor layer on the gate insulating layer above the gate electrode, source and drain electrodes on the semiconductor layer, and ohmic contact layers interposed between the semiconductor layer and the source and drain electrodes. In the Inverted Staggered structure, an interface between the gate insulating layer and the semiconductor layer is not exposed to the atmosphere. In addition, the gate insulating layer, the semiconductor layer, and the ohmic contact layer may be sequentially deposited on the glass substrate in a single processing chamber, whereby the TFT has improved electrical characteristics, and the ohmic contact layers may be removed above a channel by using the source and drain electrodes as a mask, thereby simplifying manufacturing processes.

FIG. 1 is a plan view of an LCD device according to the related art. In FIG. 1, an LCD device includes a gate line 101, a data line 205, and a pixel electrode 108. In addition, a gate electrode 101a extends from the gate line 101, and the data line including source and drain electrodes 105a and 105b is formed to be perpendicular with the gate line 101. Then, the pixel electrode 108 is formed in a pixel region defined by the gate and data lines 101 and 205 crossing each other. In addition, a semiconductor layer 203, in which a channel region is defined, is formed above the gate electrode 101a, and the source and drain electrodes 105a and 105b are formed at both sides of the channel region of the semiconductor layer 203.

FIGS. 2A to 2G are cross sectional views of manufacturing process steps of the LCD device along I–I' of FIG. 1 according to the related, and FIGS. 3A to 3G are cross sectional views of manufacturing process steps of the LCD device along II—II of FIG. 1 corresponding to FIGS. 2A to 2G according to the related art. In FIGS. 2A and 3A, a metal layer is deposited on an entire surface of a lower substrate 100 by-sputtering, and then the metal layer is selectively removed in a patterning process using photolithographic processes, thereby forming the gate line (101 of FIG. 1) that extends along a first direction and the gate electrode 101a that extends from the gate line 101.

In FIGS. 2B and 3B, a gate insulating layer 102 is formed on an entire surface of the lower substrate 100 including the gate line 101 and the gate electrode 101a.

In FIGS. 2C and 3C, the semiconductor layer (203 of FIG. 1) is deposited on the gate insulating layer 102, and then selectively patterned to remain on the gate insulating layer 102 above the gate electrode 101a, thereby forming an active layer of the TFT. In addition, the semiconductor layer (203 in FIG. 1) is formed by sequentially depositing an amorphous silicon layer 103 and an impurity-doped layer 104. In FIG. 3C, the semiconductor layer is not formed above the gate line 101.

In FIGS. 2D and 3D, a metal layer 105 is deposited on an entire surface of the lower substrate 100 including the semiconductor layer 203. After depositing a photoresist on the entire surface of the metal layer 105, a photoresist pattern 106 is formed by exposure and developing processes with a mask for patterning the data line and the source and drain electrodes.

In FIGS. 2E and 3E, the metal layer 105 is selectively etched by using the photoresist pattern 106 as the mask, thereby forming the data line (205 of FIG. 1), wherein the source electrode 105a extends from the data line 205 and the drain electrode 105b is formed apart from the source electrode 105a. In FIG. 3E, a step difference is generated between portions of the lower substrate 100 and the gate line 101. Moreover, the step difference is generated between one portion of the lower substrate 100 having the gate line 101 and the other portion of the lower substrate 100 having no gate line, thereby deteriorating step coverage characteristics of the gate insulating layer 102. As a result, the gate insulating layer 102 is not elaborate. In regions D, some residual metal components of the metal layer 105 penetrate into the gate insulating layer 102 since the metal layer 105 remains along the step difference of the gate insulating layer 102.

In FIG. 2F, the impurity-doped layer 104 that forms the semiconductor layer 203 is removed using the source and drain electrodes 105a and 105b as the mask, thereby forming an ohmic contact layer 104a. At this time, an ashing process is performed before or after selectively removing the impurity-doped layer 104.

In FIG. 2G, a passivation layer is formed on an entire surface of the lower substrate 100 including the source and drain electrodes 105a and 105b, and then selectively removed to expose a predetermined portion of the drain electrode 105b, thereby forming a contact hole. Subsequently, a transparent conductive layer is formed on an entire surface of the lower substrate 100 including the contact hole, and then the pixel electrode 108 is formed electrically connected to the drain electrode 105b through the contact hole by patterning the transparent conductive layer.

In FIG. 3G, the residual metal components of the metal layer 105 are formed within the regions D (in FIG. 3E) that is the step difference of the gate insulating layer 102. The residual metal components remain on the step difference portion during processes for selectively removing the impurity-doped layer 104 in the TFT region (in FIG. 2F), and depositing the passivation layer on an entire surface of the lower substrate. As a result, dark dots may be generated and/or insulating characteristics may be deteriorated. In addition, a passivation layer 107 is formed over the gate insulating layer 102 and the regions D (in FIG. 3E) to reduced the step difference of the gate insulating layer 102.

However, when forming the metal layer of molybdenum Mo, residual amounts of the metal layer remain on the gate insulating layer after patterning of the metal layer. Specifically, in the step difference portion of the gate insulating layer according to the gate line, the residual amounts of the metal layer significantly penetrate into the gate insulating layer, thereby generating the dark dots and deteriorating the insulating characteristics of the gate insulating layer. In addition, it is not possible to remove the residual amounts of the Mo layer during wet-etching for patterning the source and drain electrodes.

SUMMARY OF THE INVENTION

Accordingly, the present invention is directed to a method for manufacturing an LCD device that substantially obviates one or more problems due to limitations and disadvantages of the related art.

An object of the present invention is provide a liquid crystal display device having improved performance reliability.

Another object of the present invention is to provide a method for manufacturing a liquid crystal display device having improved performance reliability.

Additional features and advantages of the invention will be set forth in the description which follows, and in part will be apparent from the description, or may be learned from practice of the invention. The objectives and other advantages of the invention will be realized and attained by the structure particularly pointed out in the written description and claims hereof as well as the appended drawings.

To achieve these objects and other advantages and in accordance with the purpose of the invention, as embodied and broadly described herein, a method for manufacturing a liquid crystal display device includes forming a gate line and a gate electrode on a substrate, forming a gate insulating layer on an entire surface of the substrate including the gate line, forming a semiconductor layer on the gate insulating layer above the gate electrode, depositing a metal layer on an entire surface of the gate insulating layer including the semiconductor layer, forming a mask pattern for patterning a data line and source and drain electrodes on the metal layer, and forming a data line perpendicular to the gate line, and the source and drain electrodes by simultaneously removing portions of the metal layer with the mask pattern and removing a first thickness of the gate insulating layer.

In another aspect, a method of manufacturing a liquid crystal display device includes forming a gate line and a gate electrode on a substrate, forming a gate insulating layer on an entire surface of the substrate including the gate line, forming a semiconductor layer on the gate insulating layer above the gate electrode by sequentially depositing a silicon layer and an impurity-doped silicon layer, depositing a metal layer on an entire surface of the gate insulating layer including the semiconductor layer, forming a photoresist pattern for patterning a data line and source and drain electrodes on the metal layer, forming the data line and the source and drain electrodes by selectively removing portions of the metal layer using the photoresist pattern as a mask, simultaneously performing a pre-ashing process to the photoresist pattern and removing a first thickness of a first portion of the gate insulating layer, forming an ohmic contact layer by selectively removing portions of the impurity-doped silicon layer using the photoresist pattern as a mask, and removing the photoresist pattern.

In another aspect, a method of manufacturing a liquid crystal display device includes forming a gate line and a gate electrode on a substrate, forming a gate insulating layer on an entire surface of the substrate including the gate line, forming a semiconductor layer on the gate insulating layer above the gate electrode by sequentially depositing a silicon layer and an impurity-doped silicon layer, depositing a metal layer on an entire surface of the gate insulating layer including the semiconductor layer, forming a photoresist pattern for patterning a data line and source and drain electrodes on the metal layer, forming the data line and the source and drain electrodes by selectively removing first portions of the metal layer using the photoresist pattern as a mask, forming an ohmic contact layer by simultaneously removing portions of the impurity-doped silicon layer using the photoresist pattern as the mask and removing a first thickness of the gate insulating layer, and removing the photoresist pattern.

In another aspect, a liquid crystal display device is formed by a method including forming a gate line and a gate electrode on a substrate, forming a gate insulating layer on an entire surface of the substrate including the gate line, forming a semiconductor layer on the gate insulating layer above the gate electrode, depositing a metal layer on an entire surface of the gate insulating layer including the semiconductor layer, forming a mask pattern for patterning a data line and source and drain electrodes on the metal layer, and forming a data line perpendicular to the gate line, and the source and drain electrodes by simultaneously removing portions of the metal layer with the mask pattern and removing a first thickness of the gate insulating layer.

In another aspect, a liquid crystal display device is formed by a method including forming a gate line and a gate electrode on a substrate, forming a gate insulating layer on an entire surface of the substrate including the gate line, forming a semiconductor layer on the gate insulating layer above the gate electrode by sequentially depositing a silicon layer and an impurity-doped silicon layer, depositing a metal layer on an entire surface of the gate insulating layer including the semiconductor layer, forming a photoresist pattern for patterning a data line and source and drain electrodes on the metal layer, forming the data line and the source and drain electrodes by selectively removing portions of the metal layer using the photoresist pattern as a mask, simultaneously performing a pre-ashing process to the photoresist pattern and removing a first thickness of a first portion of the gate insulating layer, forming an ohmic contact layer by selectively removing portions of the impurity-doped silicon layer using the photoresist pattern as a mask, and removing the photoresist pattern.

In another aspect, a liquid crystal display device is formed by a method including forming a gate line and a gate electrode on a substrate, forming a gate insulating layer on an entire surface of the substrate including the gate line, forming a semiconductor layer on the gate insulating layer above the gate electrode by sequentially depositing a silicon layer and an impurity-doped silicon layer, depositing a metal layer on an entire surface of the gate insulating layer including the semiconductor layer, forming a photoresist pattern for patterning a data line and source and drain electrodes on the metal layer, forming the data line and the source and drain electrodes by selectively removing first portions of the metal layer using the photoresist pattern as a mask, forming an ohmic contact layer by simultaneously removing portions of the impurity-doped silicon layer using the photoresist pattern as the mask and removing a first thickness of the gate insulating layer, and removing the photoresist pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
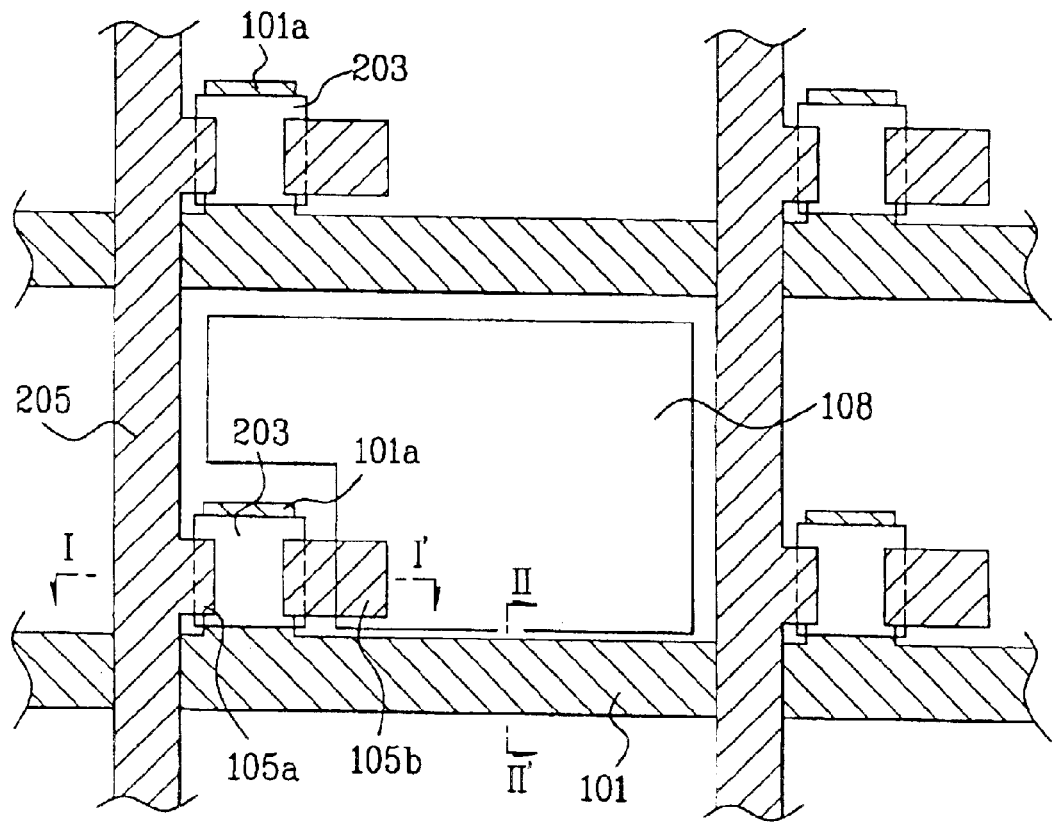
FIG. 1 is a plan view of an LCD device according to the related art.
Figure 2A:
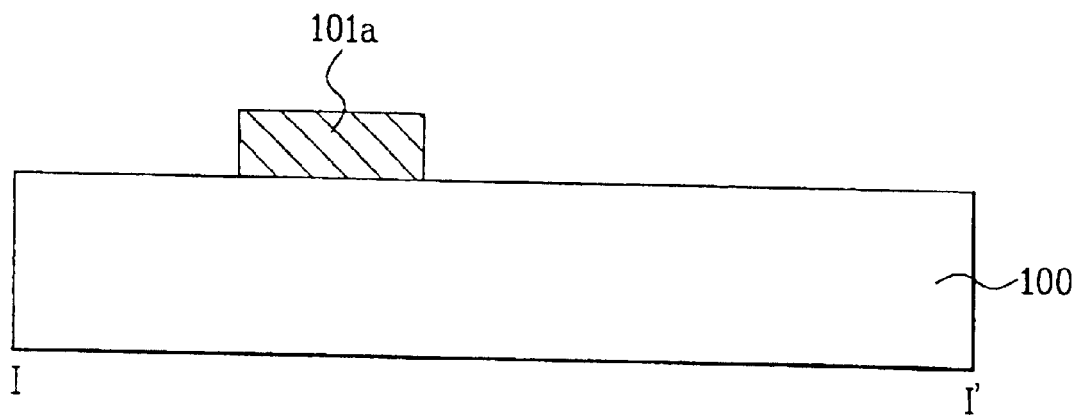
FIGS. 2A to 2G are cross sectional views of manufacturing process steps of the LCD device along I–I' of FIG. 1 according to the related.
Figure 2B:
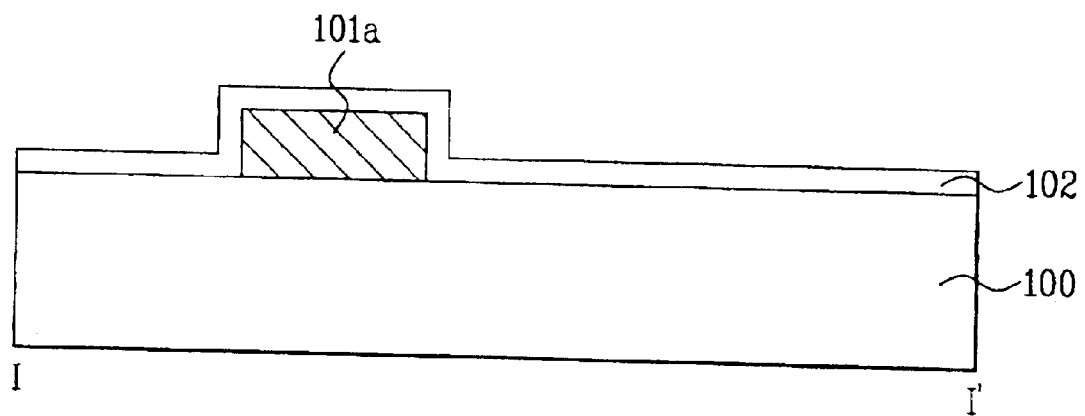
Figure 2C:
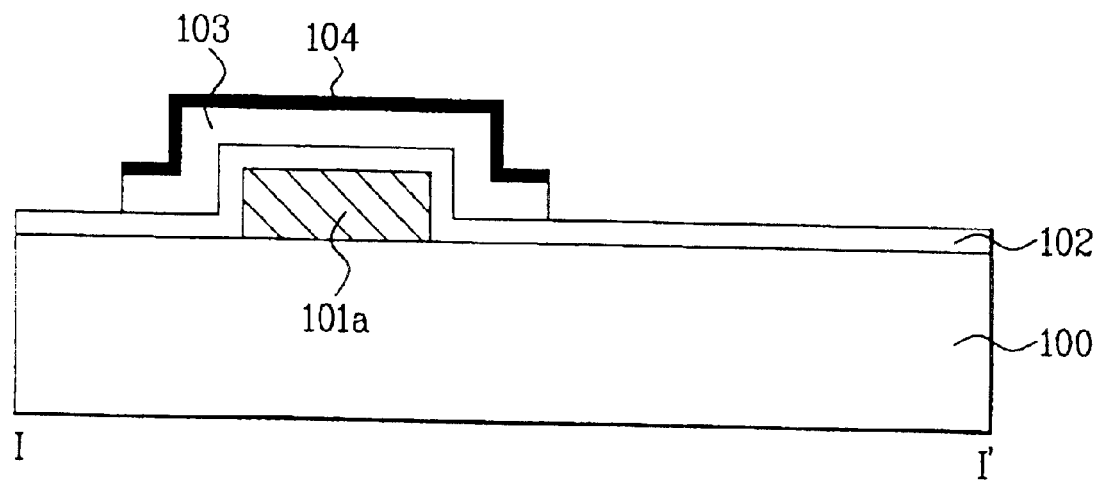
Figure 2D:
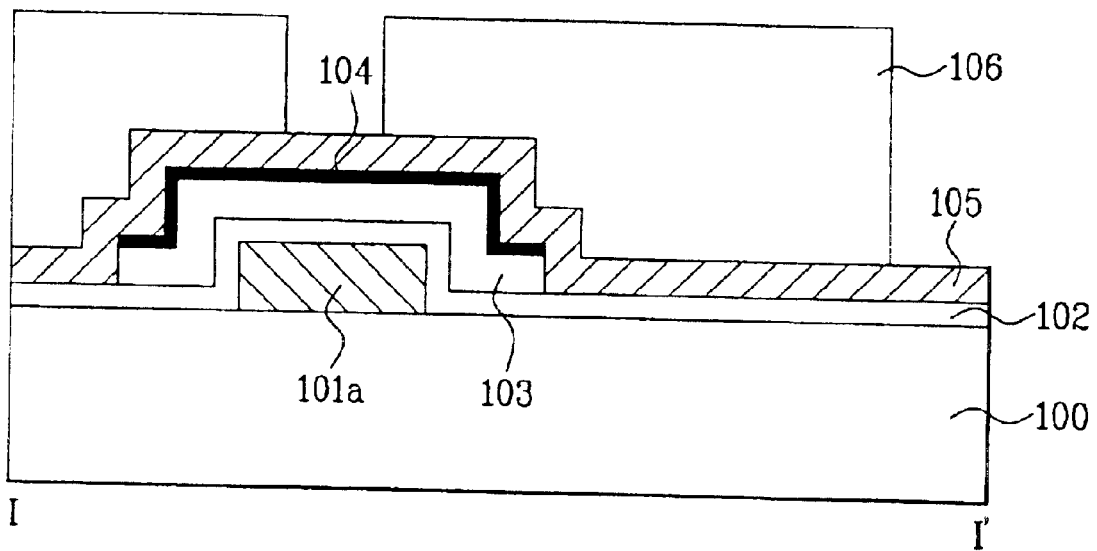
Figure 2E:
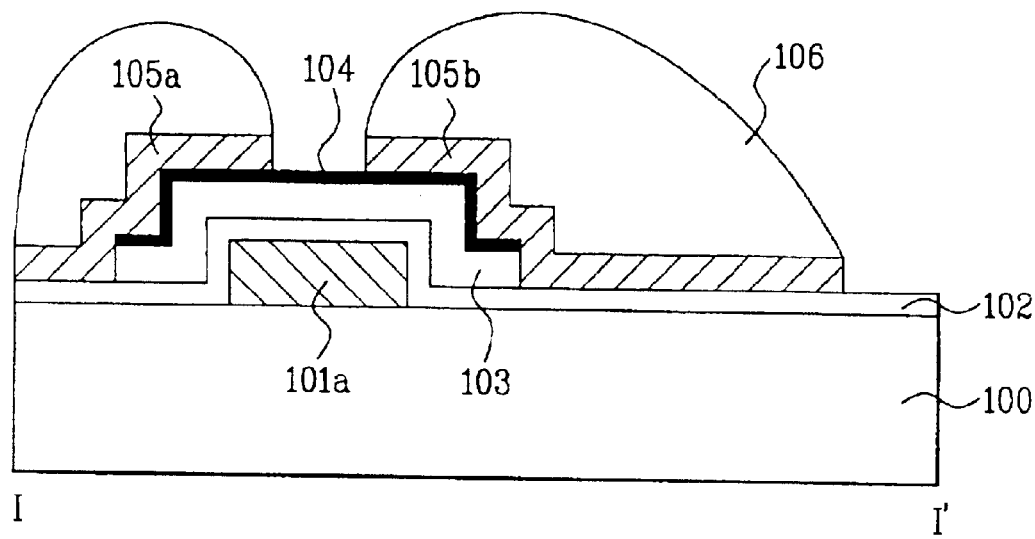
Figure 2F:
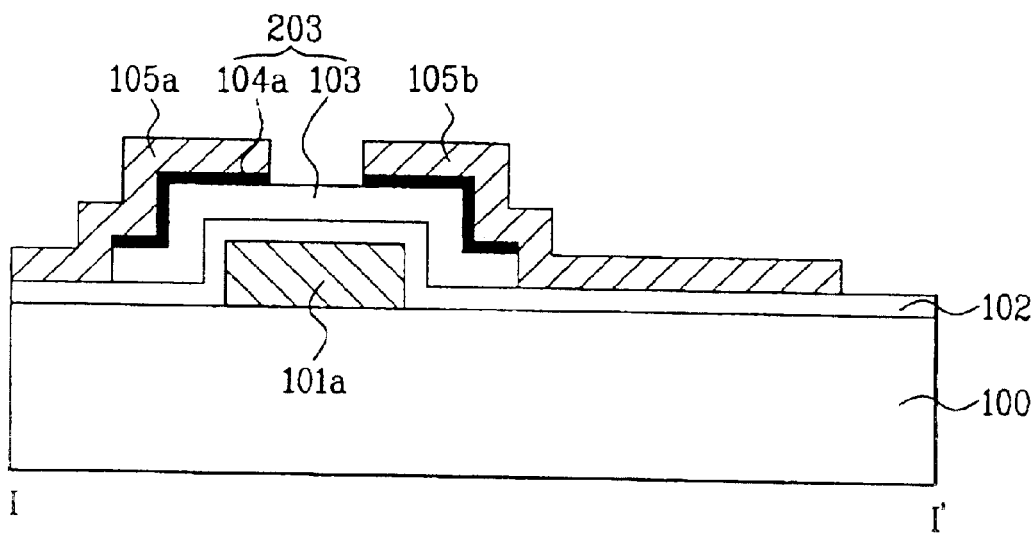
Figure 2G:
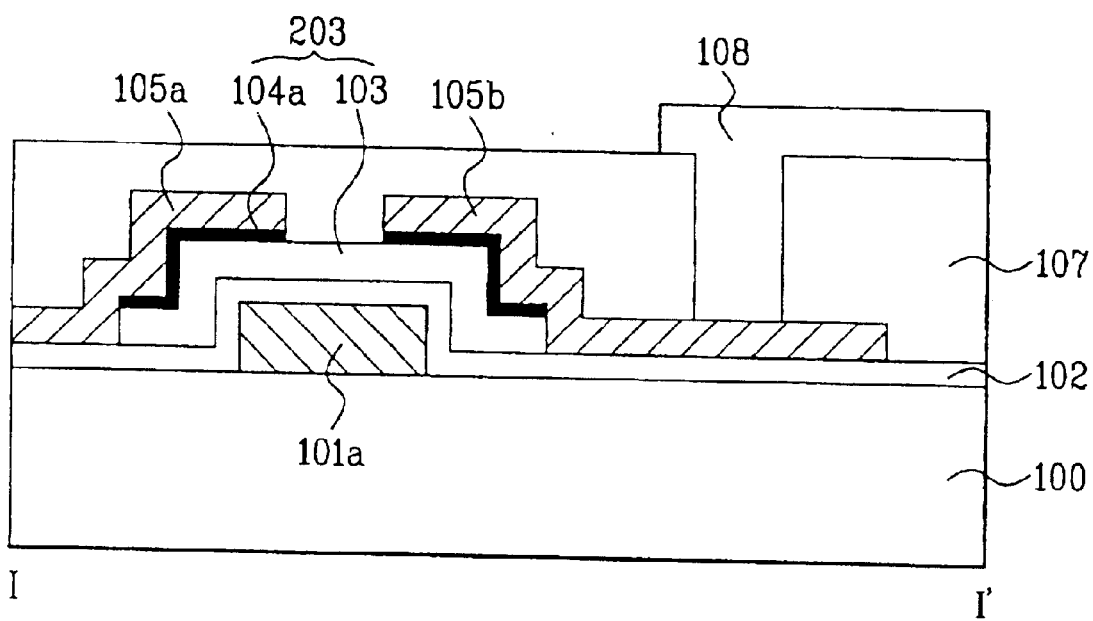
Figure 3A:
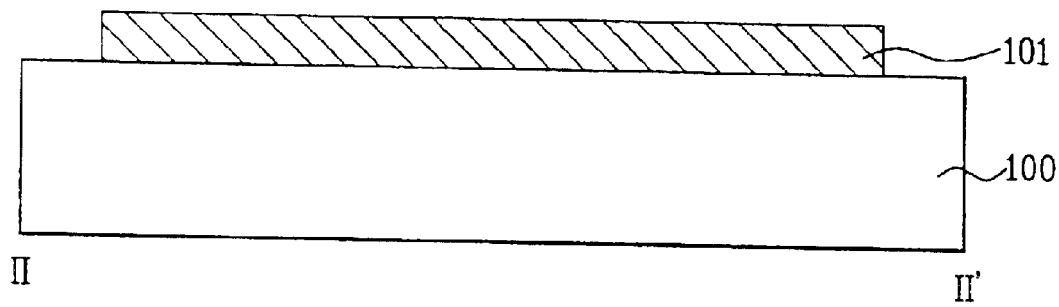
FIGS. 3A to 3G are cross sectional views of manufacturing process steps of the LCD device along II—II of FIG. 1 corresponding to FIGS. 2A to 2G according to the related.
Figure 3B:
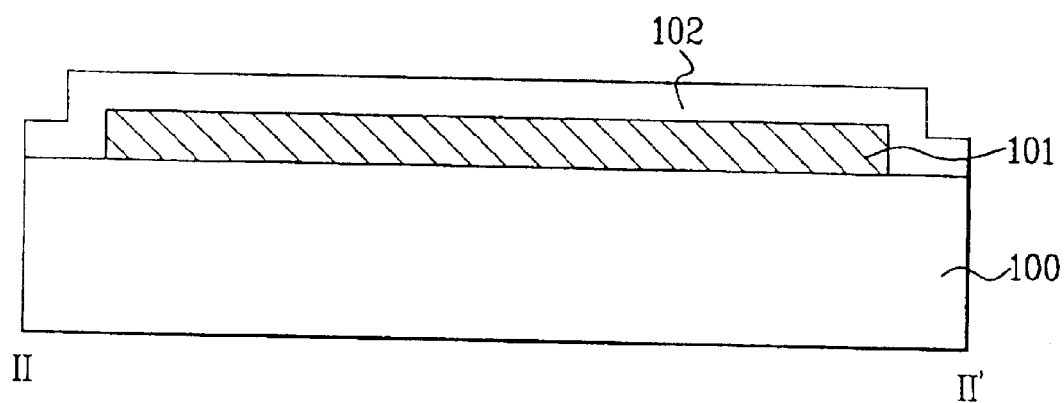
Figure 3C:
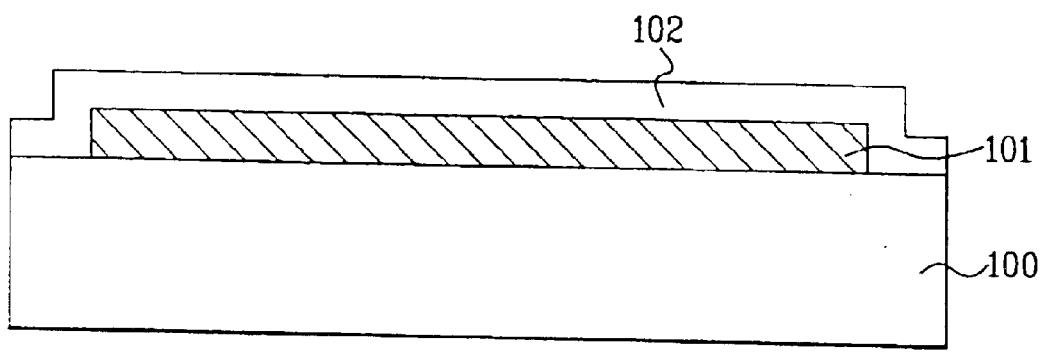
Figure 3D:
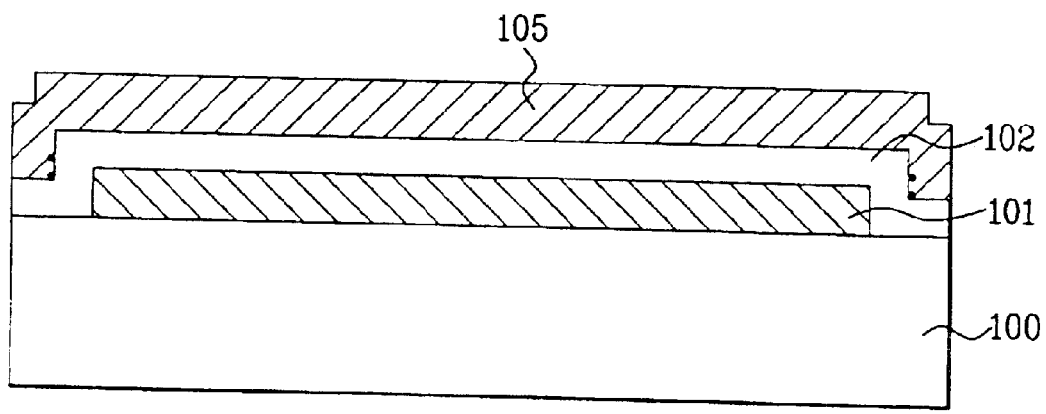
Figure 3E:
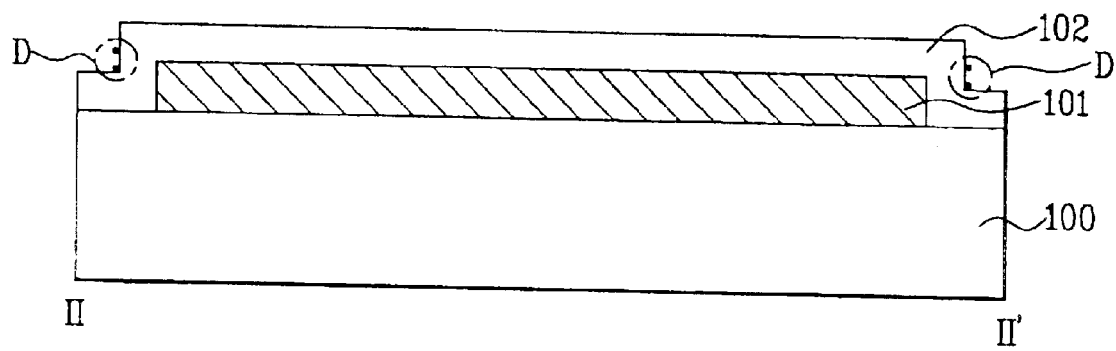
Figure 3F:
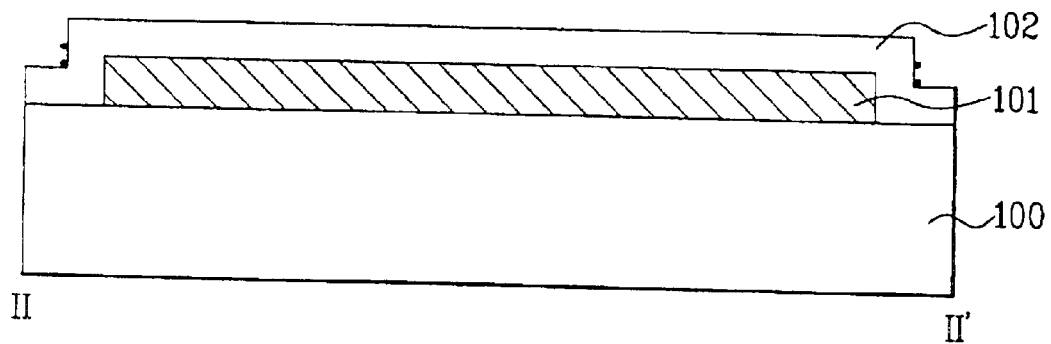
Figure 3G:
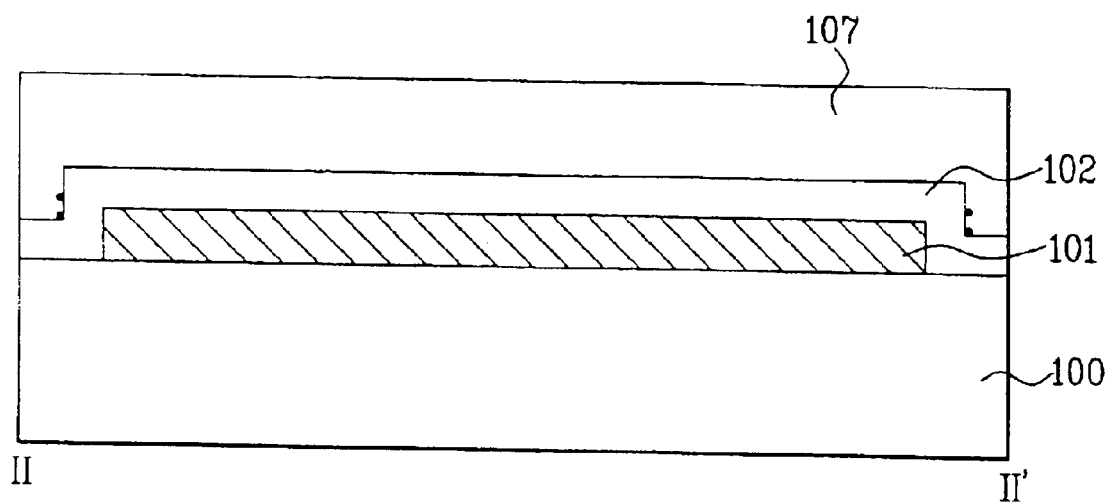
Figure 4A:
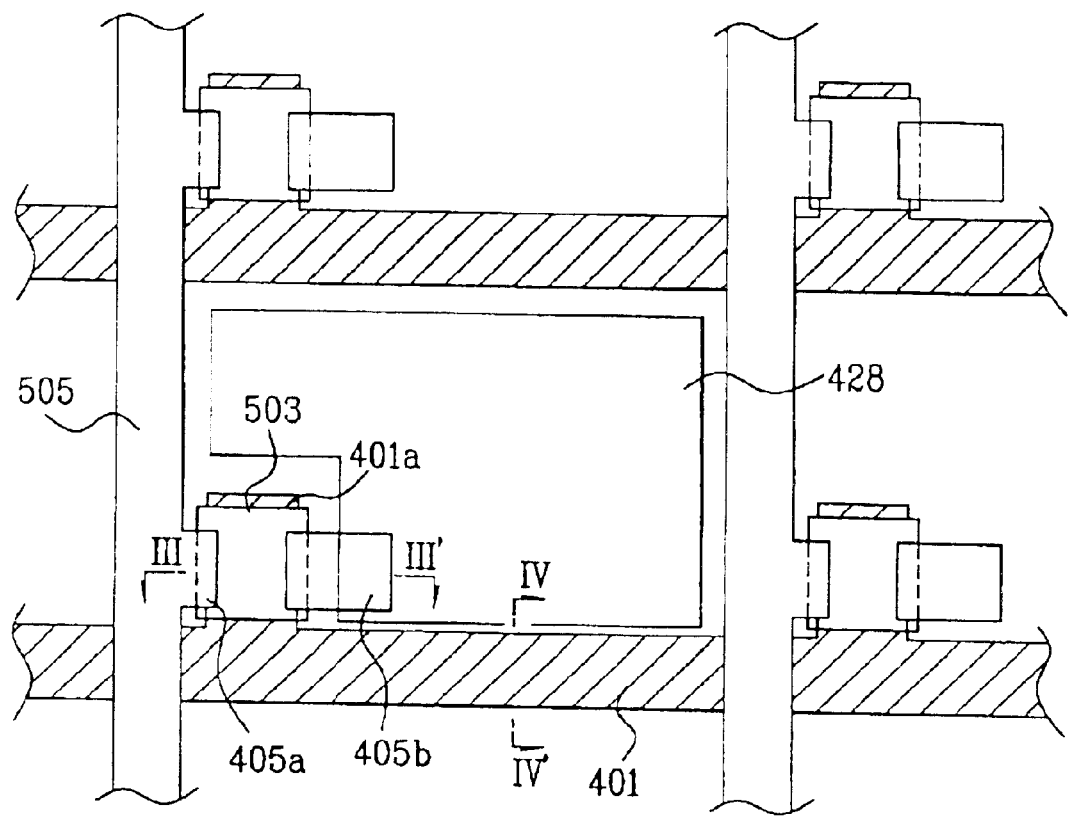
FIG. 4A is a plan view of an exemplary LCD manufacturing method according to the present invention.
Figure 4B:
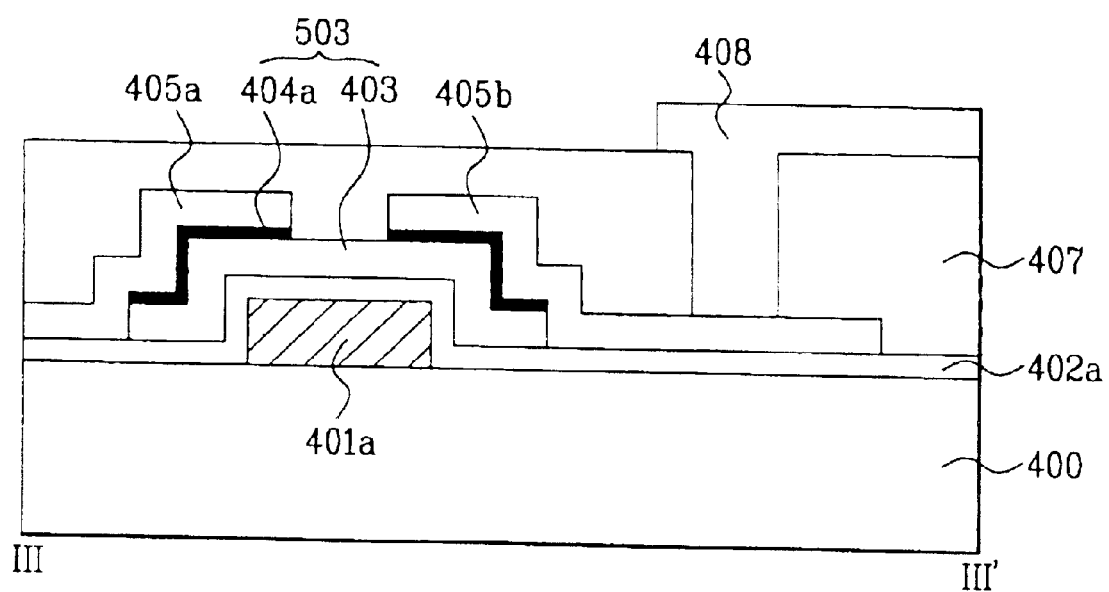
FIG. 4B is a cross sectional view along III–III' of FIG. 4A according to the present invention.

FIG. 4A is a plan view of an exemplary LCD manufacturing method according to the present invention, and FIG. 4B is a cross sectional view along III–III' of FIG. 4A according to the present invention. In FIGS. 4A and 4B, the exemplary LCD manufacturing method may include forming a gate line 401, forming a data line 505 perpendicular to the gate line 401, and forming a pixel electrode 408. In addition, a gate electrode 401a may be formed to extend from the gate line 401, source and drain electrodes 405a and 405b may be formed to extend from the data line 505, and the pixel electrode 428 may be formed within a pixel region defined by the gate and data lines 401 and 505 to be connected with the drain electrode 405b. Then, a semiconductor layer 503 may be formed above the gate electrode 401a, and may include a silicon layer 403 and ohmic contact layers 404a. A channel region is defined within the silicon layer 403, and the source and drain electrodes 405a and 405b may be connected to both sides of the channel region of the semiconductor layer 503.

Figure 5A:
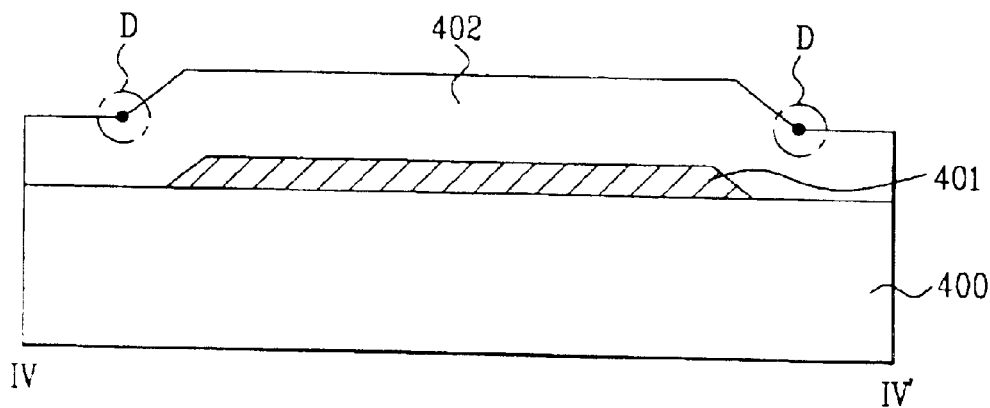
FIGS. 5A and 5B are cross sectional views of another exemplary manufacturing process along IV–IV' of FIG. 4A according to the present invention.
Figure 5B:
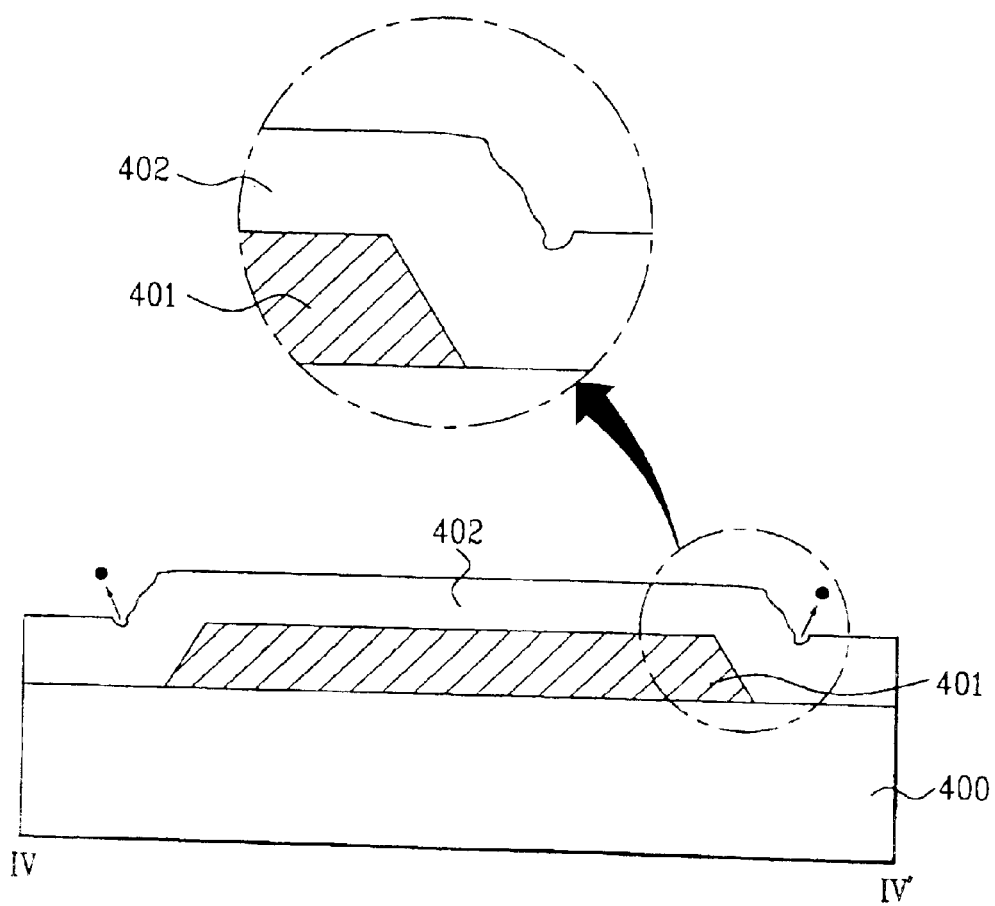

FIGS. 5A and 5B are cross sectional views of another exemplary manufacturing process along IV–IV' of FIG. 4A according to the present invention. In FIGS. 4A, 4B, and 5A, a metal layer may be deposited on an entire surface of a substrate 400 by sputtering. Then, portions of the metal layer may be selectively removed during patterning using a photolithographic process to form the gate line 401 having the gate electrode 401a. Subsequently, a gate insulating layer 402 may be formed on an entire surface of the substrate 400 including the gate electrode 401 and the gate line 401 to a thickness between about 4000 Å and about 4500 Å. Then, an amorphous silicon or polysilicon layer 403 and an impurity-doped silicon layer 404a may be sequentially formed on the gate insulating layer 402. Next, portions of the silicon layer 403 may be selectively removed to remain above the gate electrode 401a, thereby forming the semiconductor layer 503. Next, a metal layer may be formed on an entire surface of the gate insulating layer 402 including the semiconductor layer 503. The metal layer may include a metal material, such as molybdenum Mo.

Next, a photoresist (not shown) may be formed on an entire surface of the substrate 400. Then, during exposure and developing processes, a photoresist pattern (not shown) may be formed for subsequent patterning of the data line 505 and the source and drain electrodes 405a and 405b. Next, the metal layer may be wet-etched by using the photoresist pattern as a mask to form the source and drain electrodes 405a and 405b, and the data line 505 perpendicular to the gate line 401. During the wet-etch process of the metal layer, some residual components of the metal layer may penetrate into the gate insulating layer 402. Accordingly, within step difference portions of the gate insulating layer 402 according to the gate line 401, the residual metal components of the metal layer significantly penetrate into the gate insulating layer 402. When molybdenum Mo is used for the data line 505 and the source and drain electrodes 405a and 405b, the residual components of the metal layer are more disadvantageous as when the data line 505 and the source and drain electrodes 405a and 405b are formed of different metal materials.

In FIG. 4B, the impurity-doped silicon layer 404a may be etched by using the photoresist pattern (not shown) as the mask for patterning the data line 505 and the source and drain electrodes 405a and 405b, thereby forming the ohmic contact layers 404a. In addition, pre-ashing or post-ashing processes may be performed for removing the photoresist pattern (not shown) prior to or after etching of the impurity-doped silicon layer 404a.

In FIG. 5B, during the pre-ashing process, significant amounts of $SF_6$ gas may be provided. Accordingly, since the etch ratio of the $SF_6$ gas is relatively large with respect to the gate insulating layer 402 and the etch ratio of $O_2$ is relatively large with respect to the photoresist, the etch ratio of the gate insulating layer 402 in the step difference portions of the gate insulating layer 402 is improved. In addition, although an entire surface of the gate insulating layer 402 is etched, an amount of the etched thickness may not be uniform. For example, the gate insulating layer 402 is etched to a first thickness between about 100 Å and about 500 Å in the step difference portions according to the gate line 401, while the gate insulating layer 402 is etched to a second thickness of about 100 Å±20 Å in other portions. In addition, the etch process of the gate insulating layer 402a may be performed together with the ashing process. Thus, it is necessary to increase RF power, etching time, and $SF_6$ gas inflow to ensure adequate etching of the gate insulating layer 402a. However, the insulating characteristics of the gate insulating layer 402 may not deteriorate at a thickness of about 3500 Å or more after completing the etching process of the gate insulating layer 402.

Next, a passivation layer 407 may be deposited on an entire surface of the substrate 400 including the data line 505 and the source and drain electrodes 405a and 405b. Then, a contact hole may be formed for exposing a portion of the drain electrode 405b. Next, a transparent conductive layer may be formed on an entire surface of the substrate 400 including within the contact hole, and patterned to form the pixel electrode 408 in electrical contact with the drain electrode through the contact hole.

Figure 6A:
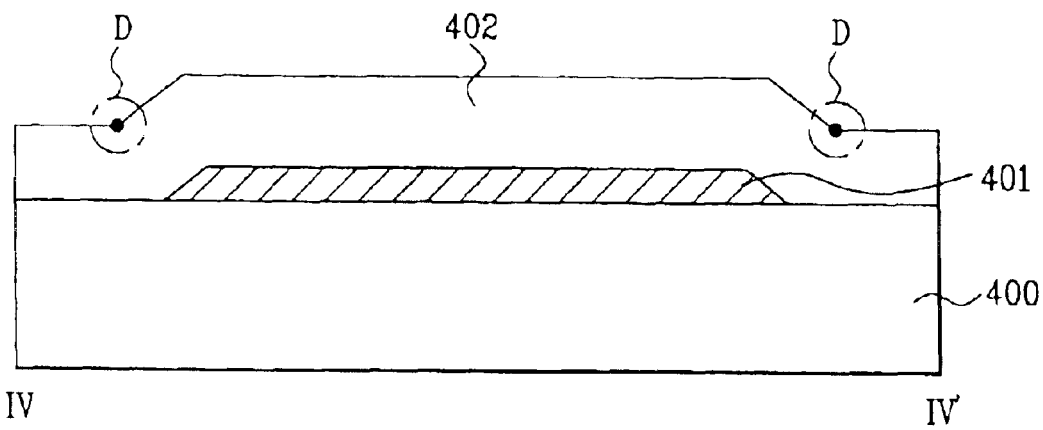
FIGS. 6A to 6C are cross sectional views of another exemplary manufacturing process along IV–IV' of FIG. 4A according to the present invention.
Figure 6B:
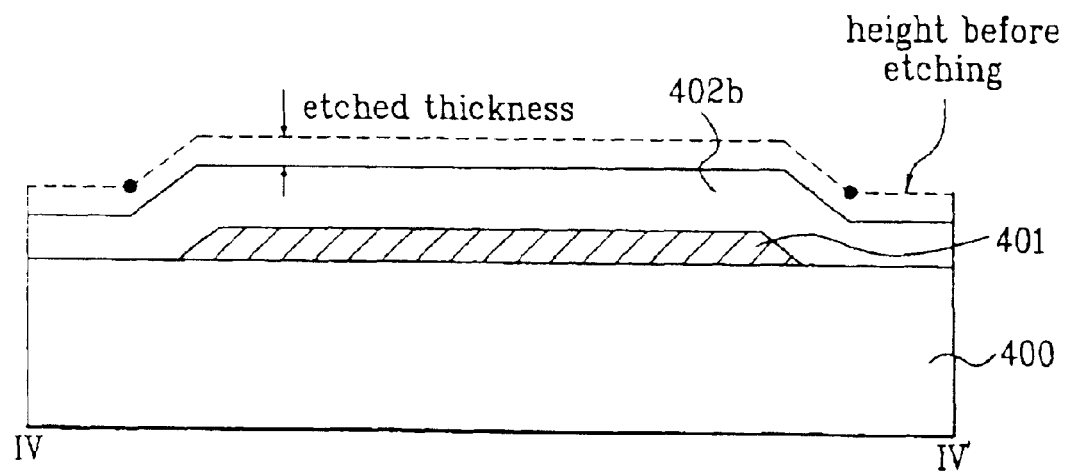
Figure 6C:
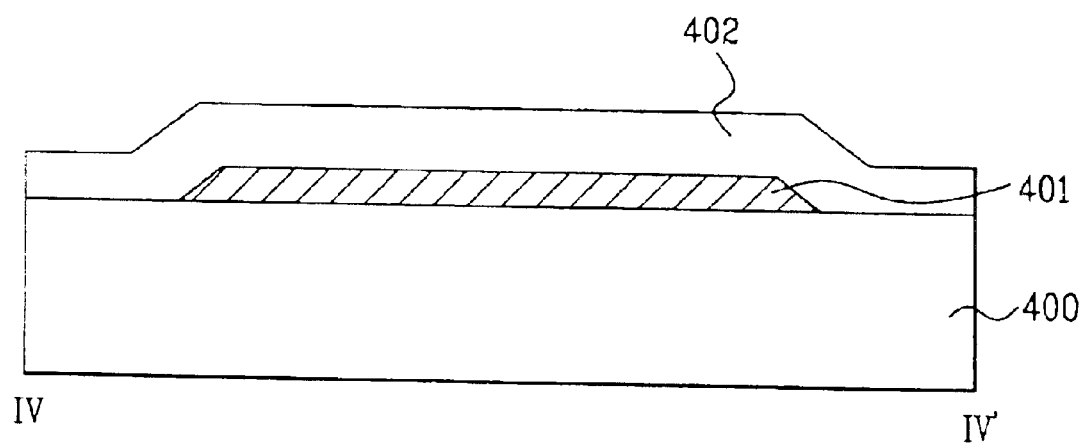

FIGS. 6A to 6C are cross sectional views of another exemplary manufacturing process along IV–IV' of FIG. 4A according to the present invention. In the exemplary manufacturing, an entire surface of a gate insulating layer 402 may be etched to a first thickness during a dry-etch process of an impurity-doped silicon layer 404a (in FIG. 4) by using a photoresist pattern (not shown) as a mask for patterning a data line and source and drain electrodes.

In FIGS. 4A, 4B, and 6A, a gate electrode 401a and a gate line 401 may be formed on a substrate 400, and a gate insulating layer 402 may be formed on an entire surface of the substrate 400. Then, a semiconductor layer 503 may be formed on the gate insulating layer 402 above the gate electrode 401a, and a metal layer (not shown) may be deposited on an entire surface of the substrate 400 including the semiconductor layer 503. The photoresist pattern (not shown) may be formed on the metal layer for patterning a data line 505 and source and drain electrodes 405a and 405b. By patterning the metal layer with the photoresist pattern as the mask, the source and drain electrodes 405a and 405b and the data line 505 may be formed. However, some residual components of the metal layer may penetrate into the gate insulating layer 402 in portion D having a step difference portion.

In FIGS. 4A and 6B, portions of the impurity-doped silicon layer 404a may be removed at a thin film transistor region during the dry-etch process by using the photoresist pattern as a mask for patterning the data line 505 and source and drain electrodes 405a and 405b. If the dry-etch process is performed on an entire surface of the substrate 400 when the RF power is increased, portions of the gate insulating layer 402 may be removed at a uniform thickness as well as a portion the impurity-doped silicon layer 404a. Accordingly, the etched portion of the gate insulating layer 402 may be between about 100 Å and about 500 Å. After removing the etched portion of the gate insulating layer 402, a remaining thickness of the gate insulating layer 402 may be about 3500 Å or more, so that insulating characteristics of the gate insulating layer 402 may not deteriorate.

The dry-etch process may be performed using $Cl_2$ gas as an etchant, wherein the $Cl_2$ gas has similar etch ratios to the impurity-doped silicon layer 404a and to the gate insulating layer 402. After the dry-etch process, the gate insulating layer 402 may be etched to a thickness similar to the thickness of the removed portion of the impurity-doped silicon layer 404a. Accordingly, the photoresist pattern (not shown) remains on the source and drain electrodes 405a and 405b after a pre-ashing process, whereby the photoresist pattern protects the source and drain electrodes 405a and 405b from being etched during the dry-etch process.

In FIG. 6C, after completing the dry-etch process by increasing the RF power and pressure, residual components of the metal layer may be removed from a surface of the gate insulating layer 402. Accordingly, insulating characteristics of the gate insulating layer 402 may not be changed. Subsequently, the residual photoresist pattern may be removed during a post-ashing process.

Accordingly, after forming the source and drain electrodes, the residual components of the metal layer may be removed at the step difference portion according to the gate line, thereby preventing dark dots from being generated. As a result, device reliability of the LCD device may be improved.

It will be apparent to those skilled in the art that various modifications and variations can be made in the liquid crystal display device and method of manufacturing a liquid crystal display device of the present invention without departing from the spirit or scope of the invention. Thus, it is intended that the present invention covers the modifications and variations of this invention provided they come within the scope of the appended claims and their equivalents.

What is claimed is:

1. A method for manufacturing a liquid crystal display device, comprising:
   forming a gate line and a gate electrode on a substrate;
   forming a gate insulating layer on an entire surface of the substrate including the gate line;
   forming a semiconductor layer on the gate insulating layer above the gate electrode;
   depositing a metal layer on an entire surface of the gate insulating layer including the semiconductor layer;
   forming a mask pattern for patterning a data line and source and drain electrodes on the metal layer; and
   forming a data line perpendicular to the gate line, and the source and drain electrodes by simultaneously removing portions of the metal layer with the mask pattern and removing a first thickness of the gate insulating layer.

2. The method according to claim 1, wherein the data line and the source and drain electrodes are formed by wet-etching the metal layer.

3. The method according to claim 1, wherein the semiconductor layer is formed by sequentially depositing a silicon layer and an impurity-doped silicon layer.

4. The method according to claim 1, wherein the metal layer includes molybdenum.

5. A method of manufacturing a liquid crystal display device, comprising:
   forming a gate line and a gate electrode on a substrate;
   forming a gate insulating layer on an entire surface of the substrate including the gate line;
   forming a semiconductor layer on the gate insulating layer above the gate electrode by sequentially depositing a silicon layer and an impurity-doped silicon layer;
   depositing a metal layer on an entire surface of the gate insulating layer including the semiconductor layer;
   forming a photoresist pattern for patterning a data line and source and drain electrodes on the metal layer;
   forming the data line and the source and drain electrodes by selectively removing portions of the metal layer using the photoresist pattern as a mask;
   simultaneously performing a pre-ashing process to the photoresist pattern and removing a first thickness of a first portion of the gate insulating layer;
   forming an ohmic contact layer by selectively removing portions of the impurity-doped silicon layer using the photoresist pattern as a mask; and
   removing the photoresist pattern.

6. The method according to claim 5, wherein the first thickness of gate insulating layer is between about 100 Å and about 500 Å within step difference portions according to the gate line.

7. The method according to claim 6, wherein second portions of the gate insulating layer are removed to a second thickness of about 100 Å±20 Å during the step of simultaneously performing the pre-ashing process and removing the first thickness of the gate insulating layer.

8. The method according to claim 5, wherein a first amount of $SF_6$ gas and a first amount of $O_2$ gas are provided during the pre-ashing process.

9. The method according to claim 8, wherein the first amount of $SF_6$ gas is greater than the first amount of $O_2$ gas.

10. The method according to claim 5, wherein the metal layer includes molybdenum.

11. A method of manufacturing a liquid crystal display device, comprising:
    forming a gate line and a gate electrode on a substrate;
    forming a gate insulating layer on an entire surface of the substrate including the gate line;
    forming a semiconductor layer on the gate insulating layer above the gate electrode by sequentially depositing a silicon layer and an impurity-doped silicon layer;
    depositing a metal layer on an entire surface of the gate insulating layer including the semiconductor layer;
    forming a photoresist pattern for patterning a data line and source and drain electrodes on the metal layer;
    forming the data line and the source and drain electrodes by selectively removing first portions of the metal layer using the photoresist pattern as a mask;
    forming an ohmic contact layer by simultaneously removing portions of the impurity-doped silicon layer using the photoresist pattern as the mask and removing a first thickness of the gate insulating layer; and
    removing the photoresist pattern.

12. The method according to claim 11, wherein $Cl_2$ gas is used for etching the gate insulating layer during formation of the ohmic contact layer.

13. The method according to claim 11, wherein the metal layer includes molybdenum.

14. A liquid crystal display device formed by a method, comprising:
    forming a gate line and a gate electrode on a substrate;
    forming a gate insulating layer on an entire surface of the substrate including the gate line;
    forming a semiconductor layer on the gate insulating layer above the gate electrode;
    depositing a metal layer on an entire surface of the gate insulating layer including the semiconductor layer;
    forming a mask pattern for patterning a data line and source and drain electrodes on the metal layer; and
    forming a data line perpendicular to the gate line, and the source and drain electrodes by simultaneously removing portions of the metal layer with the mask pattern and removing a first thickness of the gate insulating layer.

15. A liquid crystal display device formed by a method, comprising:
    forming a gate line and a gate electrode on a substrate;
    forming a gate insulating layer on an entire surface of the substrate including the gate line;
    forming a semiconductor layer on the gate insulating layer above the gate electrode by sequentially depositing a silicon layer and an impurity-doped silicon layer;
    depositing a metal layer on an entire surface of the gate insulating layer including the semiconductor layer;
    forming a photoresist pattern for patterning a data line and source and drain electrodes on the metal layer;
    forming the data line and the source and drain electrodes by selectively removing portions of the metal layer using the photoresist pattern as a mask;
    simultaneously performing a pre-ashing process to the photoresist pattern and removing a first thickness of a first portion of the gate insulating layer;
    forming an ohmic contact layer by selectively removing portions of the impurity-doped silicon layer using the photoresist pattern as a mask; and
    removing the photoresist pattern.

16. A liquid crystal display device formed by a method, comprising:

forming a gate line and a gate electrode on a substrate;

forming a gate insulating layer on an entire surface of the substrate including the gate line;

forming a semiconductor layer on the gate insulating layer above the gate electrode by sequentially depositing a silicon layer and an impurity-doped silicon layer;

depositing a metal layer on an entire surface of the gate insulating layer including the semiconductor layer;

forming a photoresist pattern for patterning a data line and source and drain electrodes on the metal layer;

forming the data line and the source and drain electrodes by selectively removing first portions of the metal layer using the photoresist pattern as a mask;

forming an ohmic contact layer by simultaneously removing portions of the impurity-doped silicon layer using the photoresist pattern as the mask and removing a first thickness of the gate insulating layer; and removing the photoresist pattern.

* * * * *